United States Patent
Jiang et al.

(10) Patent No.: US 10,520,763 B2
(45) Date of Patent: Dec. 31, 2019

(54) VCOM DRIFT IMPROVEMENTS BY NEW DESIGN AND COMPENSATION TECHNIQUES

(71) Applicant: Apple Inc., Cupertino, CA (US)

(72) Inventors: Shih-Chyuan Fan Jiang, San Jose, CA (US); Zhibing Ge, Los Altos, CA (US); Lei Zhao, Santa Clara, CA (US); Chaohao Wang, Sunnyvale, CA (US); Paul P. Lu, Cupertino, CA (US)

(73) Assignee: Apple Inc., Cupertino, CA (US)

(*) Notice: Subject to any disclaimer, the term of this patent is extended or adjusted under 35 U.S.C. 154(b) by 52 days.

(21) Appl. No.: 15/703,843

(22) Filed: Sep. 13, 2017

(65) Prior Publication Data
US 2018/0350283 A1   Dec. 6, 2018

Related U.S. Application Data

(60) Provisional application No. 62/515,974, filed on Jun. 6, 2017.

(51) Int. Cl.
| | |
|---|---|
| G02F 1/1333 | (2006.01) |
| G02F 1/1337 | (2006.01) |
| G02F 1/1343 | (2006.01) |
| G09G 3/36 | (2006.01) |
| H01L 27/12 | (2006.01) |
| H01L 29/66 | (2006.01) |

(Continued)

(52) U.S. Cl.
CPC ...... *G02F 1/133345* (2013.01); *G02F 1/1337* (2013.01); *G02F 1/133723* (2013.01); *G02F 1/134363* (2013.01); *G02F 1/1368* (2013.01); *G02F 2001/133715* (2013.01); *G02F 2001/136218* (2013.01); *G02F 2202/025* (2013.01); *G09G 3/3655* (2013.01); *H01L 27/1248* (2013.01); *H01L 29/66757* (2013.01)

(58) Field of Classification Search
CPC ......... G02F 1/134363; G02F 1/133345; G02F 1/1337
See application file for complete search history.

(56) References Cited

U.S. PATENT DOCUMENTS

| | | |
|---|---|---|
| 7,479,415 B2 | 1/2009 | Jeoung et al. |
| 9,134,573 B2 | 9/2015 | Lee et al. |
| 9,307,684 B2 | 4/2016 | He et al. |

(Continued)

OTHER PUBLICATIONS

Lee, Seung Hee, et al., FFS Technology, Chonbuk National University, Jeollabuk-do, Republic of Korea, email: lsh1@chonbuk.ac.kr, 2015.

(Continued)

*Primary Examiner* — Dung T Nguyen
(74) *Attorney, Agent, or Firm* — Jaffery Watson Mendonsa & Hamilton LLP

(57) ABSTRACT

Liquid crystal display systems and methods of operation are described. In an embodiment, a liquid crystal display pixel cell includes an insulation layer spanning over a passivation layer and the plurality of signal electrodes such that it separates the signal electrodes from polymer alignment layer for the liquid crystal. In an embodiment, a method of operating a liquid crystal display panel includes temporal compensation of the Vcom value as a function of time and one or more operating parameters.

10 Claims, 7 Drawing Sheets

(51) Int. Cl.
    *G02F 1/1368*     (2006.01)
    *G02F 1/1362*     (2006.01)

(56) References Cited

U.S. PATENT DOCUMENTS

| | | | |
|---|---|---|---|
| 2003/0052847 A1* | 3/2003 | Okishiro | G02F 1/134363 345/87 |
| 2014/0139504 A1 | 5/2014 | Zhang et al. | |
| 2016/0026044 A1* | 1/2016 | Nam | G02F 1/1368 349/42 |

OTHER PUBLICATIONS

LCD screens don't flicker—or do they?, Intersil Corporation, AN1208. 0, Sep. 26, 2005.

\* cited by examiner

VCOM DRIFT IMPROVEMENTS BY NEW DESIGN AND COMPENSATION TECHNIQUES

RELATED APPLICATIONS

This application claims the benefit of priority of U.S. Provisional Application No. 62/515,974 filed Jun. 6, 2017 which is incorporated herein by reference.

BACKGROUND

Field

Embodiments described herein relate to liquid crystal displays (LCDs), and more particularly to structures and methods to address common voltage (Vcom) drift.

Background Information

A pixel element within a liquid crystal display (LCD) is commonly driven by applying a voltage across a signal electrode and a common electrode to control the orientation of liquid crystals within a liquid crystal layer. In a vertical alignment mode, the signal electrode and common electrode are arranged on opposite sides of the liquid crystal layer. Other configurations such as in-plane switching and fringe-field switching have been proposed in order to improve viewing angle. In an in-plane switching mode, the signal electrodes and common electrodes are arranged side-by side to each other on a bottom substrate as interdigital electrodes, with the liquid crystal layer formed above the interdigital electrodes. In a fringe-field switching mode, the signal electrodes are formed above a common electrode layer, with the liquid crystal layer formed above the signal electrodes.

Alignment of the liquid crystals can be accomplished by applying either a positive or negative voltage across the electrodes. LCD screens commonly set the common electrodes at a common voltage (Vcom) at a midpoint of the video signal applied to the signal electrodes. For example, if a video signal swings between 0 Volts (V) and 10 V, the Vcom may be set at 5 V. However, it has been observed that variations in panel construction may result in an optimal Vcom different from panel to panel, or across a single panel. In an exemplary circumstance where the resultant Vcom is actually 5.5 V, the positive full-scale voltage may be 4.5 V while the negative full-scale voltage swing may be 5.5 V. Thus, LCD panels may commonly exhibit flicker where the full-scale voltage differs between adjacent frames.

SUMMARY

Embodiments describe liquid crystal display systems and methods of operation. In an embodiment, a liquid crystal display pixel cell includes an insulation layer spanning over a passivation layer and the plurality of signal electrodes such that it separates the signal electrodes from polymer alignment layer for the liquid crystal. In this manner, the passivation layer may reduce the injection of charges into the alignment layer, and ultimately reduce Vcom drift over time, and the effect of Vcom drift on flicker.

In an embodiment, a method of operating a liquid crystal display panel includes temporal compensation of the Vcom value as a function of time and one or more operating parameters. A lookup table storing a collection of Vcom drift data over time can be used to dynamically apply a new Vcom to the display panel over time to mitigate flicker. It has been observed that a number of operational conditions affect Vcom drift, such as backlight intensity, gray level, and driving frequency over time. In an embodiment, the look up table may include Vcom reference values for any combination of backlight intensity, gray level, and driving frequency data over time.

In accordance with embodiments, operational data and temporal data is recorded when the display panel is turned off. This information is then referenced once the display panel is again turned on to determine whether the baseline Vcom value will be compensated due to residual Vcom drift that has not dissipated.

DETAILED DESCRIPTION

Embodiments describe LCD panel designs and methods of operation which may address Vcom drift and provide temporal compensation to improve flicker, particularly at low refresh rates where flicker may be particularly observable by a user.

In one aspect it has been observed that, in addition to flicker resulting from variations in panel construction affecting Vcom values and full-scale voltage swings, LCD panel flicker can additionally result from Vcom drift over operation time. For example, Vcom drift has been observed after hours of continuous use. It is believed that this Vcom drift may be attributed to charge accumulation that causes an imbalanced voltage on the liquid crystal over time.

Figure 1A:
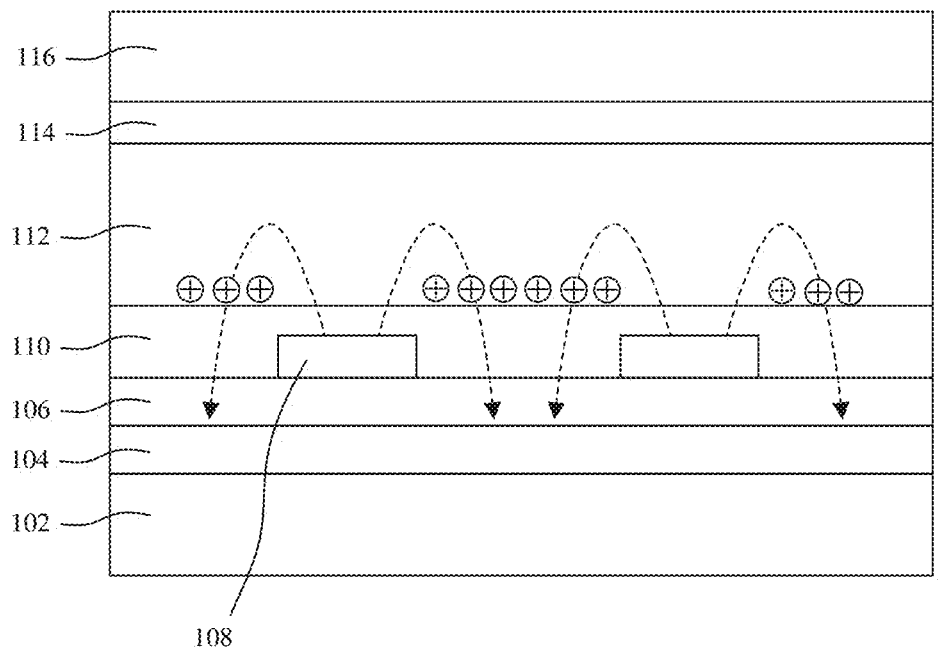
FIG. 1A is a schematic cross-sectional side view illustration of a pixel cell of a fringe-field switching (FFS) mode LCD panel with charge accumulation on an alignment layer creating an internal electric field.
Figure 1B:
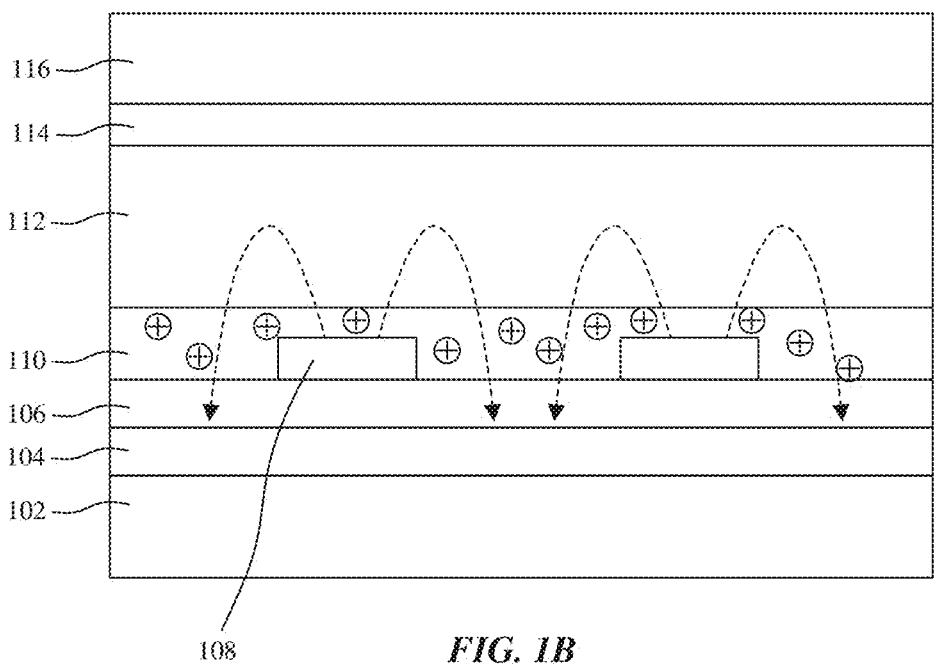
FIG. 1B is a schematic cross-sectional side view illustration of a pixel cell of a fringe-field switching (FFS) mode LCD panel with charge accumulation within an alignment layer creating an internal electric field.

FIG. 1A-1B are schematic cross-sectional side view illustrations of a pixel cell of a fringe-field switching (FFS) mode LCD panel with charge accumulation creating an internal electric field. As shown, an FFS mode LCD panel may include a glass substrate 102, a common electrode 104 on the glass substrate, a passivation layer 106 over the common electrode 104, and signal electrodes 108 on the passivation layer 106. The common electrode 104 and signal electrodes 108 may be formed of electrically conductive materials, including transparent conductive oxides (TCOs) such as indium-tin-oxide (ITO). Passivation layer 106 may be formed of transparent insulating materials such as silicon oxide (SiOx), silicon nitride (SiNx), silicon oxynitride (SiNx), etc. A polymer alignment layer 110 overlies the signal electrodes, and the liquid crystal layer 112 is formed on the polymer alignment layer 110. The polymer alignment layer 110 may be formed of transparent, organic materials such as polyimide (PI), nylon, or polyvinylalcohol (PVA). The top surface of the polymer alignment layer 110 may optionally include grooves to aide with alignment of the liquid crystals within the liquid crystal layer 112. A top alignment layer 114 may be formed over the liquid crystal layer 112, and a glass cover 116 placed over the top alignment layer 114.

Charge accumulation may result from a variety of factors. In one aspect illustrated in FIG. 1A, charge accumulation may result in the liquid crystal layer due to mobile charges/ions that accumulate above the alignment layer 110, and create an internal electric field which in turn causes an imbalanced voltage on the liquid crystal. In another aspect illustrated in FIG. 1B, charge accumulation may occur due to an imbalanced work-function between the alignment layer 110 (e.g. polyimide) and signal electrodes 108 (e.g. ITO). It is believed that the work-function difference may allow for charges to be injected from the signal electrode 108 material and into the alignment layer 110 material, where the charges become trapped and create an internal electric field which in turn causes an imbalanced voltage in the liquid crystal layer.

In accordance with embodiments, it is believed that the accumulation of charges and internal electric fields contribute Vcom drift over time, and flicker caused by Vcom drift. In this aspect, embodiments describe LCD panel designs and methods of operation which may address Vcom drift and improve flicker. In a first embodiment, a pixel cell is described in which an insulator layer is placed between an alignment layer 110 and the signal electrodes 108 to reduce the injection of charges into the alignment layer 110. In second embodiment, which may be combined with the first embodiment, a lookup table is stored on the within the display system microcontroller (μC), timing controller (TCON), or system on chip (SoC). The lookup table includes a collection of Vcom drift data over time which can be used to dynamically apply a new Vcom to the display panel over time to mitigate flicker. It has been observed that a number of operational conditions affect Vcom drift, such as backlight intensity, gray level, and driving frequency over time. In an embodiment, the look up table may include Vcom reference values for any combination of backlight intensity, gray level, and driving frequency data over time.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or in "contact" with another layer may be directly in contact with the other layer or may have one or more intervening layers. One layer "between" layers may be directly in contact with the layers or may have one or more intervening layers.

The term "on" as used in this specification in connection with a device state refers to an activated state of the device, and the term "off" refers to a de-activated state of the device. The term "on" as used herein in connection with a signal received by a device refers to a signal that activates the device, and the term "off" used in this connection refers to a signal that de-activates the device.

Figure 2A:
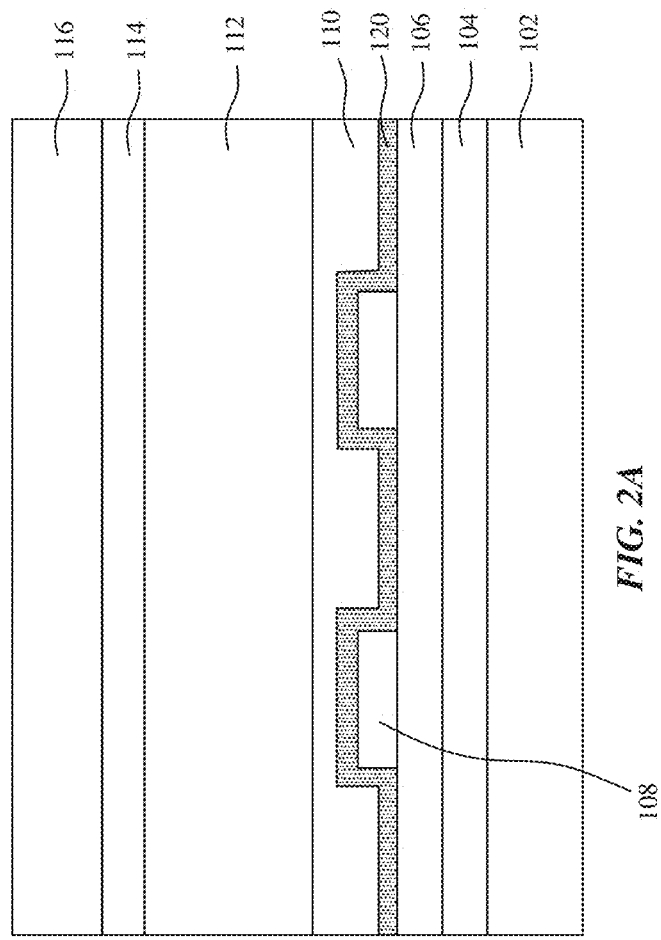
FIG. 2A is a schematic cross-sectional side view illustration of a pixel cell of a fringe-field switching (FFS) mode LCD panel with an insulation layer in accordance with an embodiment.
Figure 2B:
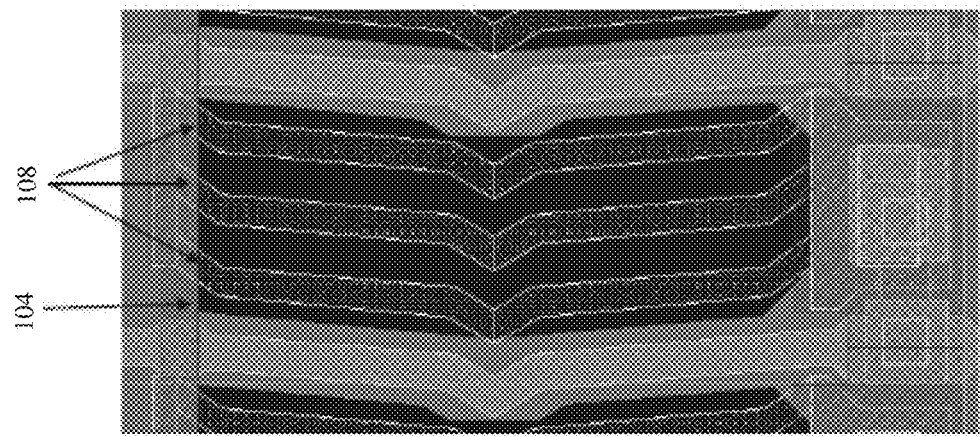
FIG. 2B is a schematic cross-sectional side view illustration of a pixel cell of a fringe-field switching (FFS) mode LCD panel in accordance with an embodiment.

Referring now to FIGS. 2A-2B, schematic cross-sectional side view and top view illustrations are provided of a pixel cell of a fringe-field switching (FFS) mode LCD panel with an insulation layer in accordance with an embodiment. In an embodiment, a liquid crystal display pixel cell includes a substrate 102 (e.g. glass), a common electrode 104 on the substrate, a passivation layer 106 over the common electrode, and one or more signal electrodes 108 on the passivation layer 106. An insulation layer 120 spans over the passivation layer 106 and the plurality of signal electrodes 108. A polymer alignment layer 110 is on the insulation layer 120, and a liquid crystal layer 112 is on the polymer alignment layer 110.

In accordance with embodiments, the insulation layer 120 is placed between the signal electrodes 108 and the polymer alignment layer 110 to remove the interface between the layers, such as an ITO-PI interface. In turn, the insulation layer 120 may be a barrier to charges being injected from the signal electrode 108 material and into the alignment layer 110 material, and the resultant internal electric field. In accordance with embodiments, the insulation layer 120 has a higher bandgap compared to the signal electrode 108 and polymer alignment layer 110. In an embodiment, the insulation layer is formed of an inorganic material, such as an oxide or nitride material. For example, the inorganic material may be silicon nitride, silicon oxide, silicon oxynitride, or high dielectric constant (e.g. above SiOx) material. In order to not significantly affect operation of the panel, the insulation layer 120 may also be thin, such as approximately 50-100 Angstroms thick.

Figure 3:
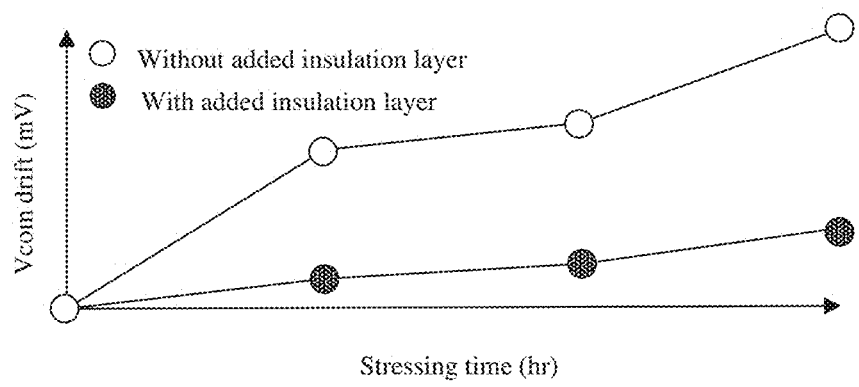
FIG. 3 is test data illustrating Vcom drift over time for an LCD panel with added insulation layer in accordance with embodiments.

FIG. 3 is test data illustrating Vcom drift over time for an LCD panel with added insulation layer 120 in accordance with embodiments. As shown, the reference test specimen with no insulation layer shows considerable more Vcom drift after an extended period of continuous operation. The test specimen including an insulation layer in accordance with embodiments demonstrated less considerably less Vcom drift after of the extended period of continuous operation.

Figure 4:
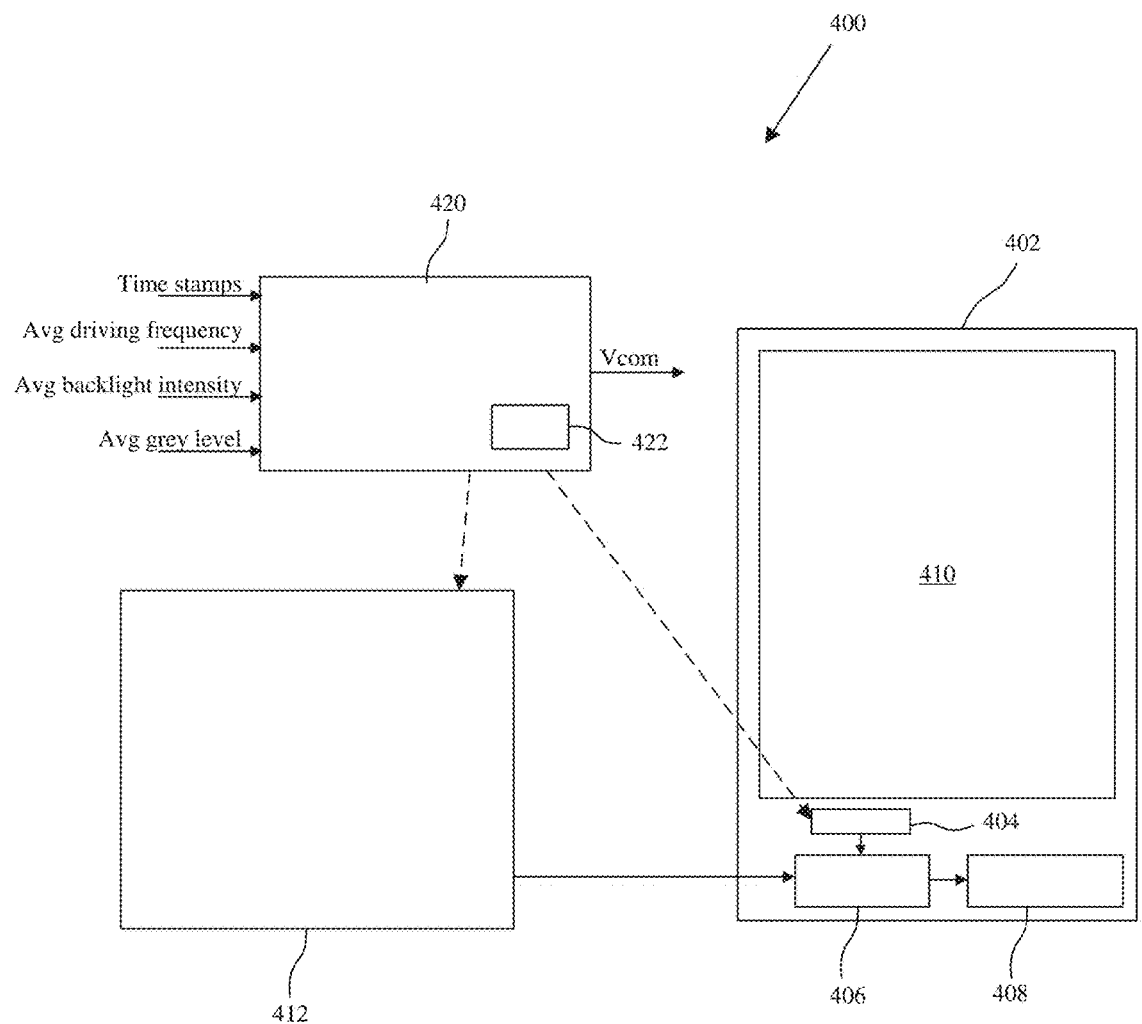
FIG. 4 is a schematic illustration of an LCD system with temporal Vcom drift compensation in accordance with an embodiment.

FIG. 4 is a schematic illustration of an LCD system 400 with temporal Vcom drift compensation in accordance with an embodiment. As shown, the LCD system 400 may include a display panel 402, including a display microcontroller (μC) 404, timing controller (TCON) 406, gamma integrated circuit (IC) 408, and display screen 410. A system on chip (SoC) 412 may optionally be included off the display panel 402. In accordance with embodiments, temporal Vcom drift compensation may be performed by a Vcom tracking and compensation algorithm 420 in firmware either in the display μC 404, the SoC 412, or TCON 406. Compensation can also be implemented with hardware, and stored within memory, in the display μC 404, the SoC 412, or TCON 406. Compensation techniques may track operating parameters such as gray level, backlight intensity, driving frequency over stressing time (e.g. continuous use). These operating parameters may also be averages over specified, repeated time frames so that the Vcom compensation is continually, or periodically updated. If this information is not available, average operating parameters can be assumed. Before the display panel is powered off, a time stamp and current Vcom value is recorded. After power on, the display off time is calculated to track decay of Vcom shift. The tracking result is sent to a gamma IC 480 as the reference voltage for a Vcom driver.

In accordance with embodiments, a Vcom tracking and compensation algorithm 420 references a lookup table 422 stored in memory. The lookup table 422 stores Vcom values as a function of time of operation. For example, the lookup table may store Vcom values as a function of time of operation and one or more operating parameters such as average gray level, average backlight intensity, and average driving frequency.

Figure 5:
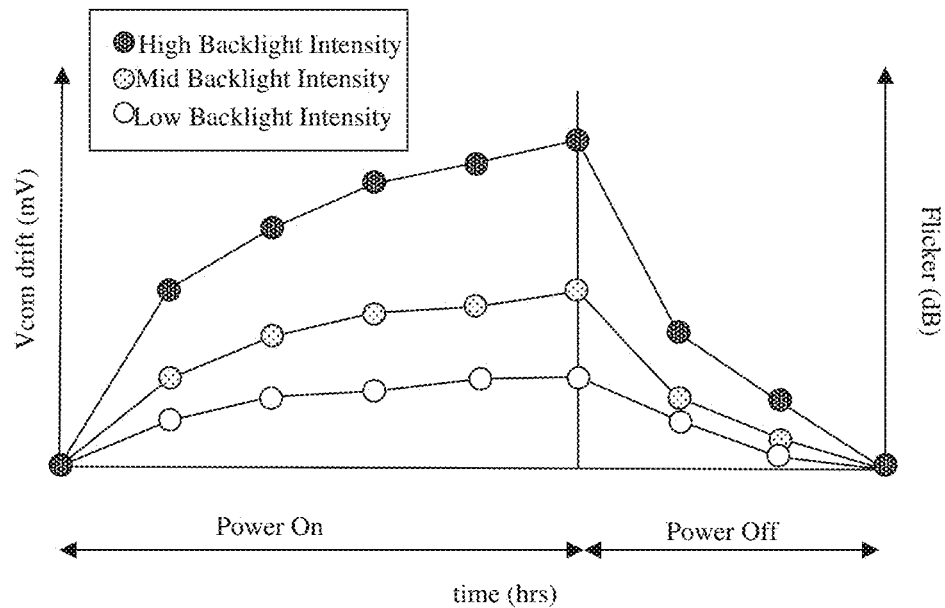
FIG. 5 is test data illustrating Vcom drift over time for LCD panels operated with different backlight intensities in accordance with embodiments.
Figure 6:
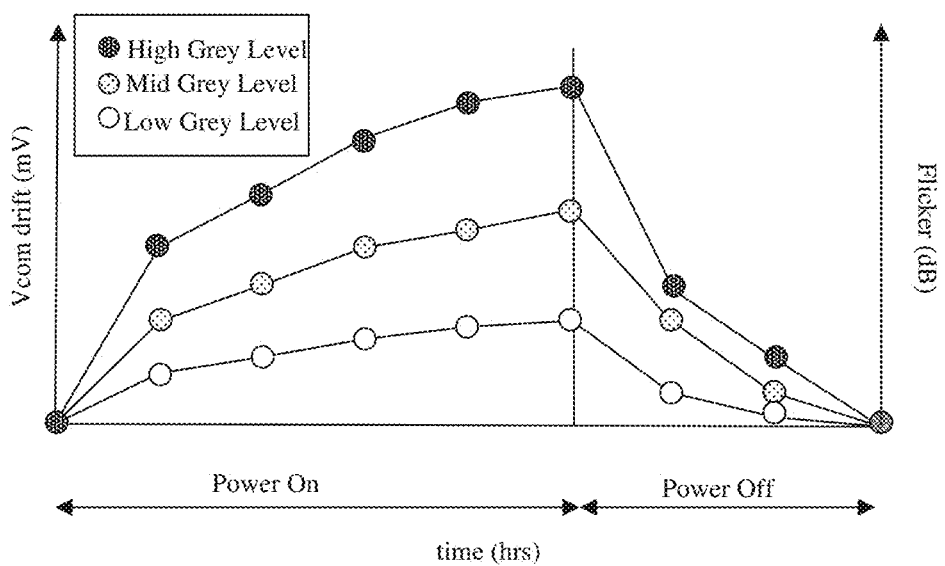
FIG. 6 is test data illustrating Vcom drift over time for LCD panels operated with different gray levels in accordance with embodiments.

In accordance with embodiments, the lookup table stores a collection of reference Vcom values based on known Vcom drift data. FIG. 5 is an exemplary implementation of test data illustrating Vcom drift over time for LCD panels operated with different backlight intensities in accordance with embodiments. FIG. 6 is an exemplary implementation of test data illustrating Vcom drift over time for LCD panels operated with different gray levels in accordance with embodiments. The data provided in FIGS. 5-6 is intended to be exemplary of data stored in the lookup table 422, and embodiments are not limited to the specific value and ranges presented. As shown in the exemplary Vcom drift data, the Vcom drift and flicker is higher with highest backlight intensities and highest gray levels. In accordance with embodiments, no-good flicker zones are located at higher regions of Vcom drift where flicker may be observable to the user, at nominal operational frequency.

In accordance with embodiments, a method of operating a display panel includes tracking an operating parameter at first time stamp during a continuous time of operation of the display panel, looking up a reference Vcom value for the operating parameter and the first time stamp, and applying the reference Vcom value to the display panel. In an embodiment, tracking the operating parameter may include tracking including one or more value of an average gray level, and average backlight intensity, and an average driving frequency. In accordance with embodiments, the reference Vcom values may be a function of the Vcom drift values (e.g. as shown in FIG. 5-6). For example, the reference Vcom values may be a function of the Vcom drift values and baseline Vcom for the display panel. The reference Vcom value may then be send to the gamma IC 408 for application to the display screen 410 of the display panel 402.

Still referring to FIGS. 5-6, it is illustrated that Vcom drift and flicker increase over time. Exemplary data is provided for a normalized amount of hours of operation, for illustrative purposes. Once the display panel is powered off, it takes some amount of time for the charge accumulation to dissipate. As a result, there may still be a residual Vcom drift if the display panel is powered on before full dissipation, which may take several hours in the exemplary data.

Figure 7A:
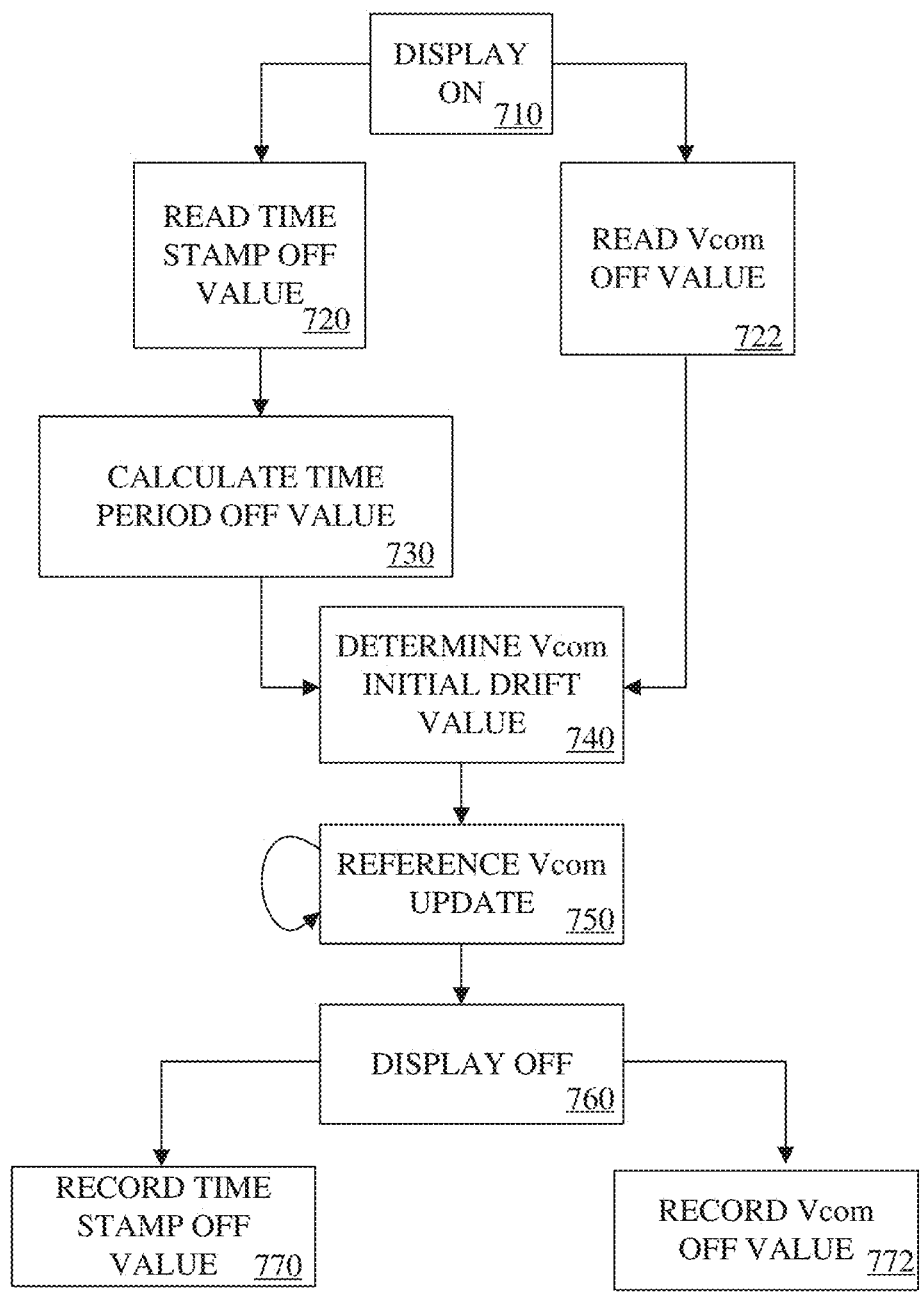
FIG. 7A is a flow chart illustrating a method of temporal Vcom drift compensation for an LCD panel in accordance with an embodiment.

Referring now to FIG. 7A a flow chart is provided illustrating a method of temporal Vcom drift compensation for an LCD panel in accordance with an embodiment. In interests of clarity, the discussion of FIG. 7A is concurrent with the discussion of FIG. 7B illustrating Vcom and time values at display on/off in accordance with an embodiment.

As shown, when turning the display panel on at operation 710, the system may initially read a time stamp off value 721 at operation 720 and a Vcom off value 723 at operation 722 that was recorded the last time the display panel was turned off. At operation 730 a time period off value 732 is calculated. For example, the time period off value 732 may be calculated by recording a time now value 731 and subtracting the time now value 731 from the time stamp off value 721. In some circumstances, residual charge accumulation may have fully dissipated. In other circumstances, particularly when the time period off is several hours or less, there may be a specific amount of residual charge and corresponding Vcom drift.

Figure 7B:
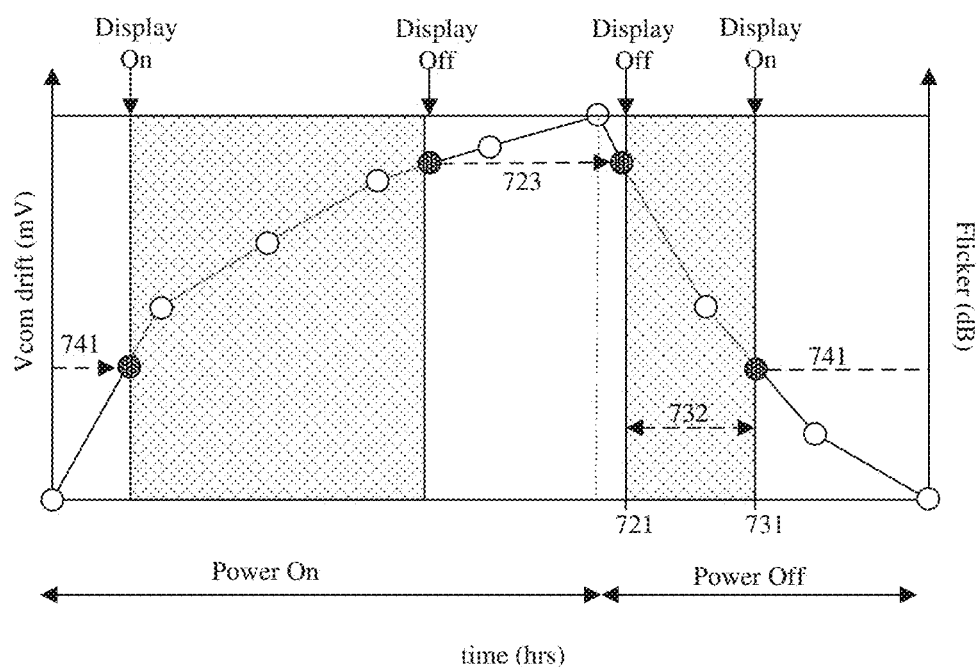
FIG. 7B is a chart illustrating Vcom and time values at display on/off in accordance with an embodiment.

Also referring now to FIG. 7B, at operation 740 a Vcom initial drift value 741 is determined. As shown, the Vcom initial drift value 741 is related to the time period off value 732 and Vcom off value 723. In an embodiment, the Vcom initial drift value 711 is determined by referencing the lookup table 422, for example, for the specified time period off value 723 and Vcom off value 723. In accordance with embodiments, if the time period off value 723 is not sufficient to allow Vcom drift to fully dissipate, then the Vcom initial drift value 711 will compensate the baseline Vcom for the display panel at the initial display on time. At operation 750 a reference Vcom value corresponding to the determined Vcom initial drift value 741 is then applied to the display panel. In an embodiment, the reference Vcom value is determined by referencing the lookup table 422, for example, for the specified Vcom initial drift value 741.

At this point, operation 750 may enter into a loop for continuous or periodic Vcom updates. For example, updates may be over a period of seconds, minutes, tens of minutes, or hourly. Updates may track (e.g. measure) an operating parameter over periodic time stamps during a continuous time of operation of the display panel. A reference Vcom value stored in the lookup table for the specified time stamp is then looked up, and the reference Vcom value is then applied to the display panel. In an embodiment, tracking the operating parameter may include tracking including one or more value of an average gray level, and average backlight intensity, and an average driving frequency. Once the display panel is tuned off at operation 760, the loop is discontinued, and a time stamp off value 721 is recorded at operation 770, and a Vcom off value 723 is recorded at operation 772.

In utilizing the various aspects of the embodiments, it would become apparent to one skilled in the art that combinations or variations of the above embodiments are possible for addressing Vcom drift and providing temporal compensation to improve flicker. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A liquid crystal display pixel cell comprising:
   a substrate;

a common electrode on the substrate;
a passivation layer over the common electrode;
a plurality of signal electrodes on the passivation layer;
an insulation layer approximately 50-100 Angstroms thick spanning over the passivation layer and the plurality of signal electrodes;
a polymer alignment layer on the insulation layer; and
a liquid crystal layer on the polymer alignment layer.

2. The liquid crystal display pixel cell of claim 1, wherein the insulation layer is formed of an inorganic material.

3. The liquid crystal display pixel cell of claim 2, wherein the inorganic material is an oxide or nitride material.

4. The liquid crystal display pixel cell of claim 2, wherein the inorganic material is selected from the group consisting of silicon nitride, silicon oxide, and silicon oxynitride.

5. The liquid crystal display pixel cell of claim 2, wherein the polymer alignment layer comprises a material selected from the group consisting of polyimide, nylon, and polyvinyl alcohol.

6. The liquid crystal display pixel cell of claim 5, wherein the plurality of signal electrodes are formed of a transparent conductive oxide.

7. The liquid crystal display pixel cell of claim 5, wherein the plurality of signal electrodes are formed of indium-tin-oxide.

8. The liquid crystal display pixel cell of claim 1, wherein the insulation layer is characterized by a higher bandgap compared to the plurality of signal electrodes and the polymer alignment layer.

9. The liquid crystal display pixel cell of claim 1, wherein the plurality of signal electrodes are thicker than the insulation layer.

10. The liquid crystal display pixel cell of claim 1, wherein the thickness of the insulation layer is conformal to the passivation layer and the plurality of signal electrodes.

* * * * *